United States Patent [19]

Henry

[11] 4,229,715

[45] Oct. 21, 1980

[54] PRECISION PHASE MODULATORS UTILIZING CASCADED AMPLITUDE MODULATORS

[75] Inventor: Paul S. Henry, Holmdel, N.J.

[73] Assignee: Bell Telephone Laboratories, Incorporated, Murray Hill, N.J.

[21] Appl. No.: 969,775

[22] Filed: Dec. 15, 1978

[51] Int. Cl.³ .............................................. H03C 3/38
[52] U.S. Cl. ...................................... 332/18; 332/22; 332/23 R
[58] Field of Search ...................... 332/16 R, 22, 23 R, 332/23 A, 18; 325/45, 47, 145

[56] References Cited

U.S. PATENT DOCUMENTS

| 3,243,730 | 3/1966 | Anderson | 332/18 |
|---|---|---|---|
| 3,651,429 | 3/1972 | Ruthroff | 332/18 |
| 3,818,378 | 6/1974 | Phillips | 332/23 A |
| 4,028,641 | 6/1977 | Bodtmann et al. | 332/18 |

*Primary Examiner*—Siegfried H. Grimm
*Attorney, Agent, or Firm*—Erwin W. Pfeifle

[57] ABSTRACT

The present invention relates to a precision phase modulator wherein a carrier signal of constant amplitude and frequency and a modulating signal are applied to the two inputs of the first one of a cascade of linear suppressed-carrier amplitude modulators. Each subsequent modulator of the cascade arrangement concurrently modulates the output signal of the previous modulator of the cascade with the modulation signal. The input carrier signal and the output signal of each modulator of the cascade is tapped-off and weighted, the weighted carrier input and outputs of the even-numbered modulators and the weighted outputs of the odd-numbered modulators are separately added and are combined in quadrature to provide a phase modulated output signal.

2 Claims, 2 Drawing Figures

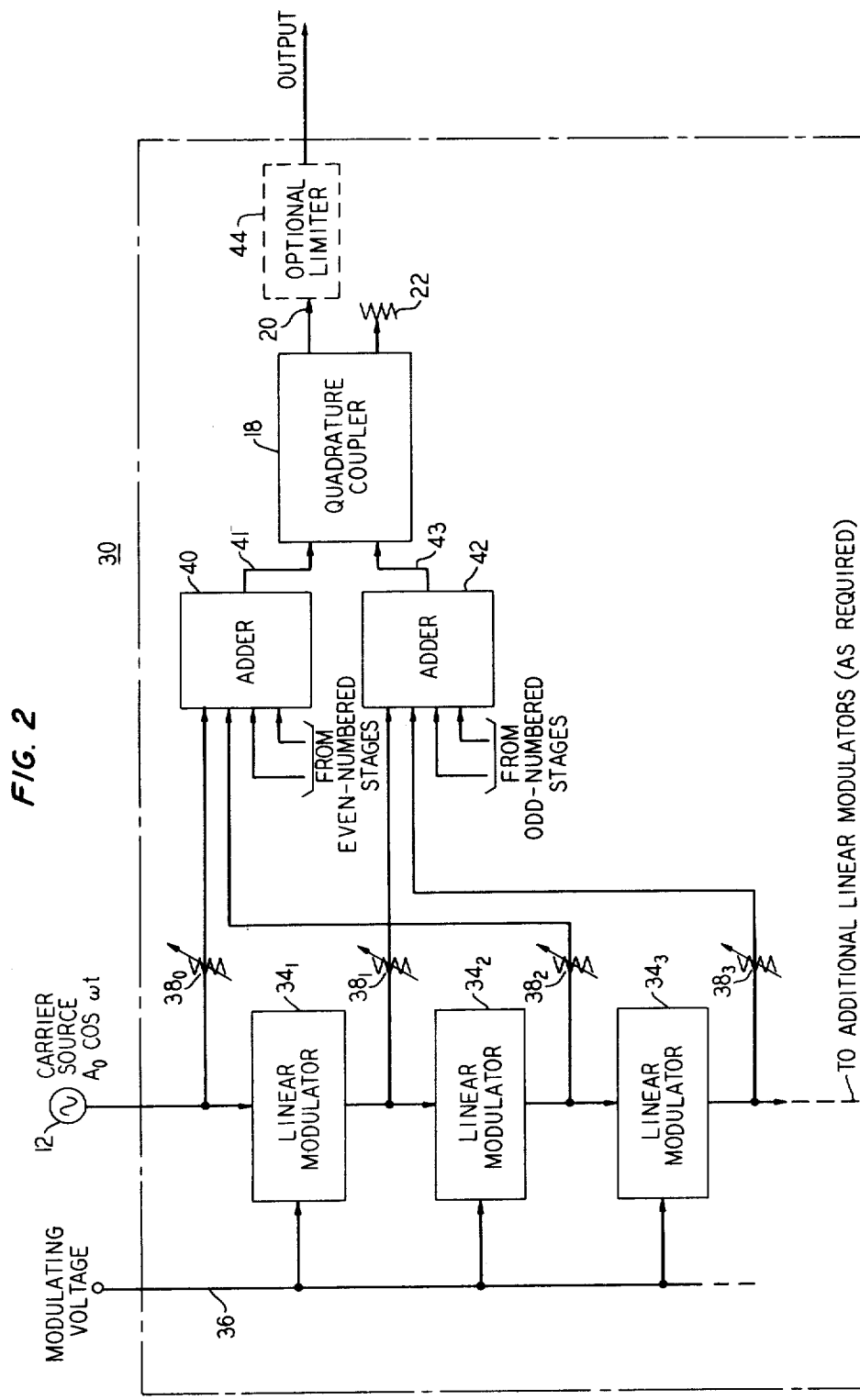

PRECISION PHASE MODULATORS UTILIZING CASCADED AMPLITUDE MODULATORS

BACKGROUND OF THE INVENTION

1. Technical Field

The present invention relatese to precision phase modulators and, more particularly, to precision phase modulators comprising a plurality of linear suppressed-carrier amplitude modulators in a cascade arrangement.

2. Description of the Prior Art

A desirable component in radio systems is a linear phase or frequency modulator. Linearity is particularly important in multilevel phase modulated systems to enable recovery of transmitted information at the recovery terminal without error.

A linear phase modulator was disclosed in U.S. Pat. No. 4,028,641 issued to W. F. Bodtmann et al on June 7, 1977 which includes a pair of Armstrong modulators in a balanced configuration for eliminating even order nonlinearities. In the Bodtmann et al arrangement, carriers are added which differ in phase from quadrature from the modulating carrier signal by equal and opposite amounts and by properly adjusting the amount of phase difference from quadrature in the added carriers, the third-order nonlinearities can also be substantially eliminated by combining the outputs of the Armstrong modulators in a multiplier circuit.

Another phase modulator circuit is disclosed in U.S. Pat. No. 3,243,730 issued to L. N. Anderson on Mar. 29, 1966 wherein the circuits use cascaded inverters with modulation applied in like phase to all inverters. More particularly, phase modulation is produced in a carrier signal by feeding the carrier signal through an even number of cascaded inverting amplifiers whose individual internal phase shifts are varied by using the modulating signal to vary their bias currents.

The problem remaining in the prior art is to provide a linear phase modulator which permits generation of precisely controlled modulation without sacrificing the desirable modulation and stable properties of the basic Armstrong design.

SUMMARY OF THE INVENTION

The foregoing problem is solved in accordance with the present invention which relates to a precision phase modulator comprising a plurality of linear suppressed-carrier amplitude modulators in a cascade arrangement. More particularly, each modulator comprises a first and a second input terminal and an output terminal and the modulators are connected in cascade with the output terminal of each modulator connected to the first input terminal of the next modulator and the first input terminal of the first modulator and all second input terminals in the cascade arrangement are connected to a source of a carrier signal and a source of a modulating signal, respectively. The phase modulator further comprises a first and a second adding means and a quadrature coupler connected to the outputs of both adder means, the first and second adder means having their input terminals connected to receive appropriately weighted signals from (a) the first input terminal of the first modulator of the cascade arrangement and the output terminals of the even-numbered modulators and (b) the output terminals of the odd-numbered modulators, respectively, of the cascade arrangement.

It is an aspect of the present invention to provide a wideband precision phase modulator which does not include frequency multiplication or feedback techniques.

Other and further aspects of the present invention will become apparent during the course of the following description and by reference to the accompanying drawings.

BRIEF DESCRIPTION OF THE DRAWINGS

Referring now to the drawings, in which like numerals represent like parts in the several views:

FIG. 2 is a block circuit diagram of a precision phase modulator according to the present invention.

DETAILED DESCRIPTION

Figure 1:
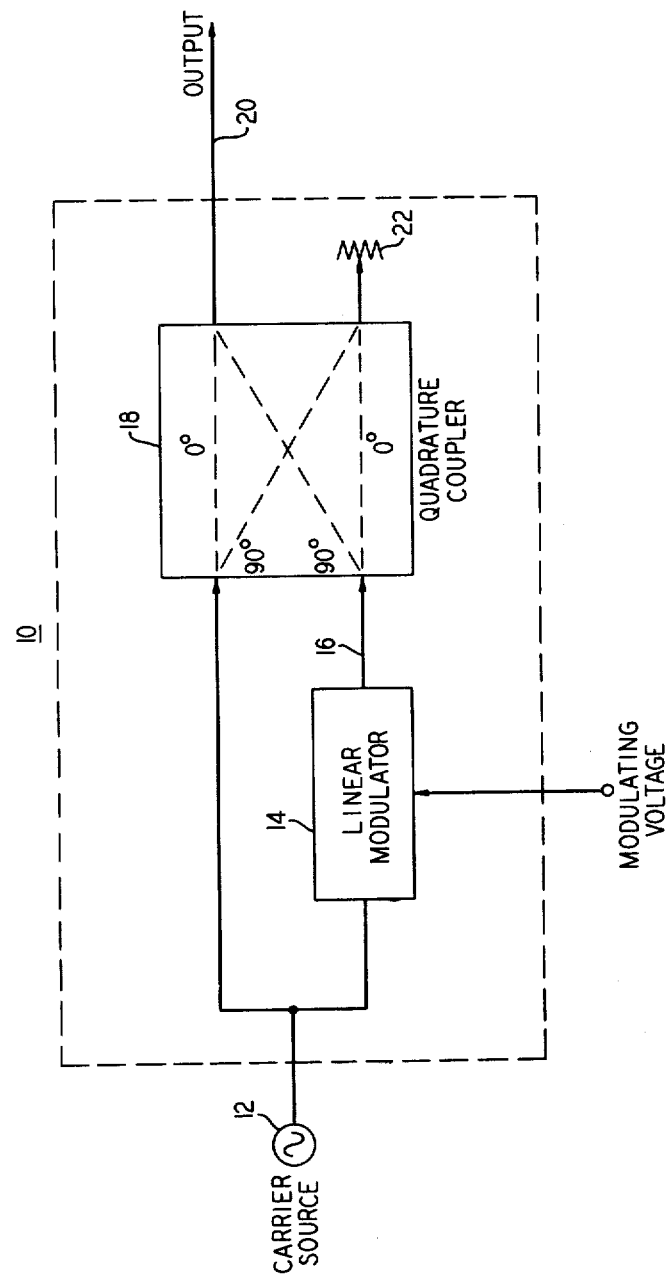
FIG. 1 is a block circuit diagram of a prior art Armstrong phase modulator.

A well-known circuit for generating approximately linear phase modulation is the Armstrong phase modulator 10 shown in FIG. 1. In the Armstrong phase modulator 10, a carrier signal from an external carrier source 12 is modulated with a modulating voltage in a linear modulator 14. The output signal from linear modulator 14 on lead 16 is a double sideband, suppressed carrier signal which is applied to one input of a quadrature coupler 18. The modulated signal from linear modulator 14 is added in quadrature in quadrature coupler 18 to the original carrier signal which is applied to a second input of quadrature coupler 18 for producing a signal at output lead 20 given by the equation $$\Theta(v) = \arctan kv, \qquad (1)$$

where v is the modulating (control) voltage and k is a constant of proportionality. The second output from coupler 18 is terminated in an appropriate impedance 22. Large-angle phase modulation is obtained by operating the Armstrong modulator 10 in its "linear" range ($kv << 1$), and frequency-multiplying the output signal on lead 20 to achieve the desired phase excursion. The Armstrong modulator 10 is attractive for radio system applications because it can impress wideband, precisely controlled modulation on a stabilized carrier signal.

FIG. 2 illustrates a wideband precision phase modulator 30 in accordance with the present invention which is a generalization of the Armstrong modulator but provides better linearity than shown in Equation (1) without resorting to frequency multiplication or feedback techniques. In precision phase modulator 30, a carrier signal of constant amplitude $A_o$ and frequency $\omega$ is generated by an external carrier source 12 on lead 32 and applied to the input of a cascade of linear suppressed-carrier amplitude modulators 34 of which three are shown and designated $34_1$ to $34_3$ in FIG. 2. The length of the cascade or the number of linear modulators 34 required depends on the modulation fidelity required.

Each linear modulator is shown as comprising a first and a second input and an output with the carrier signal on lead 32 being applied to the first input of modulator $34_1$. Each subsequent modulator 34 of the cascade of linear modulators has the first input thereof connected to the output of the previous modulator in the cascade. A modulating voltage on lead 36 is applied to the second input of each of the modulators 34 of the cascade for appropriately modulating the signal at the first input of each of the modulators 34 and generating a modulated signal at the output thereof.

The carrier signal on lead 32 and each of the outputs from linear modulators $34_1$-$34_3$ are tapped off and applied to appropriate weighting circuits $38_0$-$38_3$, respectively, which individually attenuate or amplify the associated input signal by a separate predetermined amount which is specific for each weighting circuit dependent on the stage of the cascade of modulators 34 from which the input signal is derived. The technique for determining the weighting coefficient of weighting circuits $38_0$-$38_3$ will be discussed hereinafter.

The weighted carrier signal and the weighted outputs of the even-numbered modulators $38_2$, etc. of the cascade are applied to separate inputs of a first adder circuit 40 while the weighted outputs of the odd-numbered modulators $38_1$, $38_3$, etc. are applied to separate inputs of a second adder circuit 42. The adder circuits 40 and 42 add the associated input signals and provide output signals on leads 41 and 43, respectively. The output signals on leads 41 and 43 are applied to a first and second input of a quadrature coupler 18 where the two input signals are added in quadrature to produce an output signal on lead 20. An optional limiter 44 can be used to remove amplitude variations which may be generated by coupler 18 on lead 20. It is to be understood that any suitable circuit capable of performing the described function can be used for each of the components of FIG. 2.

In operation, each linear modulator 34 transforms its input signal $V(t) \cos \omega t$ into an output signal represented by the expression $(\alpha v) \cdot V(t) \cos \omega t$, where $\alpha$ is a constant of proportionality and $v$ is the modulating or controlling voltage, which is applied to all the modulators 34. Thus the output of the nth modulator, or stage, is $(\alpha v)^n \cdot {}^nA_o \cos \omega t$. The weighted outputs of the odd-numbered stages are combined in quadrature with the weighted outputs of the even-numbered stages, including the weighted carrier signal which can be considered the zeroth stage, to produce a signal on lead 20 defined by the expression $$s(v,t) = \frac{A_o}{\sqrt{2}} \left[ \sum_{n=1,3,5,\ldots} w_n(\alpha v)^n \sin\omega t \right] + \frac{A_o}{\sqrt{2}} \left[ \sum_{n=0,2,4,6,\ldots} w_n(\alpha v)^n \right] \cos\omega t, \quad (2)$$

where the $w_n$'s are the weighting coefficients. The amplitude of $s(v,t)$ and its phase relative to the carrier $A_o \cos \omega t$ are functions of $v$. The resultant modulation carried by $s(v,t)$ can be shown explicitly by rewriting Equation (2):

$$s(v,t) = A(v) \cos [\omega t - \phi(v)], \quad (3)$$

where $$[A(v)]^2 = A_o^2/2(S_o^2 + S_e^2), \quad (4)$$

and $$\phi(v) = \arctan (S_o/S_e). \quad (5)$$

$S_o$ and $S_e$ are defined by $$S_o = \sum_{n=1,3,5,\ldots} w_n(\alpha v)^n, \text{ and} \quad (6)$$

$$S_e = \sum_{n=0,2,4,6,\ldots} w_n(\alpha v)^n. \quad (7)$$

A limiter 44 following the quadrature coupler can be used to remove any undesired amplitude modulation, leaving the phase modulation given by Equation (5).

It should be noted from Equations (5)-(7) that $\phi(v)$ must be an odd function of $v$. This restriction is not serious because a primary purpose is to provide a modulator whose phase is a linear, and therefore an odd, function of $v$.

To produce a desired phase modulation $\Psi(v)$, the $w_n$'s are chosen to satisfy the equation $$\Psi(v) = \arctan (S_o/S_e). \quad (8)$$

If it is desired to approximate $\Psi(v)$ using an N-stage modulator 30 ($w_n=0$ for $n>N$), the $w_n$'s are chosen to optimize, by whatever criterion is appropriate, the output phase given by Equation (5). If small amplitude variation at the output of the modulator 30 as shown in Equation (4) is also important, the $w_n$'s can be chosen to satisfy both phase and amplitude criteria.

A feature of the present phase modulator 30 described hereinabove is its temperature stability. As the temperature varies it might be reasonably expected that the parameter $\alpha$ will change. However, as long as the linear modulators 34 track, so that the separate $\alpha$'s vary together, the functional form of the output phase $\phi(v)$ will not vary. This can be seen from Equations (5), (6) and (7). If $\alpha$ changes to a new value $\alpha'$, the new output phase $\phi'(v)$ is given by the expression $$\phi'(v) = \phi(\alpha'/\alpha v). \quad (9)$$

Thus, if $\phi(v)$ is linear in $v$ at one temperature, it will be linear at all temperatures. This property is not generally observed in "linearized" prior art phase modulators, where one type of non-linearlity is used to cancel another. The degree of cancellation in such modulators is in general a function of the temperature.

The modulator design technique described hereinbefore will now be applied to linear phase modulation, and for such purpose the zeroth weight supplied by weighting circuit $38_0$ will be set to unity $$w_o = 1. \quad (10)$$

This results in no loss of generality, and makes finding the remaining weights somewhat simpler.

For linear phase modulation the desired modulation is given by the equation $$\Psi(v) = kv, \quad (11)$$

where k is an arbitrary constant of proportionality. For a single-stage modulator it can be found from Equations (5) and (6) that $$\phi(v) = \arctan w_1\alpha v. \quad (12)$$

Equation (12) has the same form as Equation (1), because the single-stage modulator is simply an Armstrong modulator. If the error criterion for choosing $w_1$ is minimization of phase error in a small neighborhood centered on $v=0$, then $w_1$ is determined by equating Equation (11) with a Taylor's, or MacLaurin's, series expansion of Equation (12), truncated after the linear term. This procedure yields $w_1=k/\alpha$. Therefore, from Equations (4)–(7), it can be found that $$\phi(v) = \arctan kv$$
$$= kv - \frac{(kv)^3}{3} + \ldots, \quad (13)$$

and $$A(v) = \frac{A_o}{\sqrt{2}} [1 + (kv)^2]^{\frac{1}{2}}. \quad (14)$$

The third-order phase non-linearity of Equation (13) is a characteristic of the single-stage Armstrong modulator.

It will now be shown that a two-stage modulator has significantly better linearity. From Equation (5) the output phase of a two-stage modulator is given by the equation $$\phi(v) = \arctan w_1 \alpha v / 1 + w_2(\alpha v)^2. \quad (15)$$

Proceeding as with the single-stage modulator, the phase error is minimized in the neighborhood of $v=0$ by equating Equation (11) with a second-order series expansion of Equation (15). From such equations it is found that $w_1 = k/\alpha$ and $w_2 = -k^2/3\alpha^2$, yielding $$\phi(v) = \arctan \frac{kv}{1 - \frac{1}{3}(kv)^2} \quad (16)$$
$$= kv - \frac{(kv)^5}{45} + \ldots,$$

and $$A(v) = \frac{A_o}{\sqrt{2}} \left(1 + \frac{1}{3}(kv)^2 + \frac{1}{9}(kv)^4\right)^{\frac{1}{2}}. \quad (17)$$

The first non-linear distortion term in Equation (16) is fifth-order in v. Thus a modest increase in accordance with the present invention in the complexity of the Armstrong modulator has resulted in a marked improvement in linearity from third-order, as shown in Equation (13), to fifth-order as shown in Equation (16). The amplitude variations for both modulators, however, are second-order in v.

It is sometimes advantageous to trade increased phase non-linearity for reduced amplitude variation because practical limiters often convert excessive amplitude modulation into phase modulation. For a two-stage modulator 30, choosing $w_2 = -w_1^2/2$ results in an amplitude variation which is fourth order in v. However, the best phase linearity that can be achieved under this constraint on $w_2$ corresponds to $w_1 = k/\alpha$, which yields $$\phi(v) = \arctan kv/1 - \frac{1}{2}(kv)^2 = kv + (kv)^3/6 + \ldots \quad (18)$$

The phase non-linearity has decreased to third order, as it was in the single-stage modulator.

It is to be understood that the above-described embodiments are simply illustrative of the principles of the invention. Various other modifications and changes may be made by those skilled in the art which will embody the principles of the invention and fall within the spirit and scope thereof. For example, in FIG. 2, if a two-stage phase modulator is desired using only modulators $34_1$ and $34_2$, adder 42 is not required and the output from modulator $34_1$ via weighting circuit $38_1$ can be directly connected to the lower input terminal of quadrature coupler 18.

I claim:

1. A phase modulator comprising
   a first and a second linear suppressed-carrier amplitude modulator, each modulator comprising a first and a second input terminal and an output terminal characterized in that
   the first and second modulators are connected in cascade with the output terminal of the first modulator connected to the first input terminal of the second modulator, and the first input terminal of the first modulator and the second input terminals of the first and second modulators are capable of receiving a carrier signal and a modulating signal, respectively;
   the phase modulator further comprising
   an adding means comprising a first and second input terminal coupled to the first input terminal of the first modulator and the output terminal of the second modulator, said adding means being capable of generating an output signal corresponding to the sum of the input signals;
   a quadrature coupler capable of combining in quadrature the output signals from the adding means and the first modulator to provide a phase modulated output signal; and
   a first, second and third weighting means capable of introducing a separate predetermined weighting factor to the signal being applied to the first and second input terminal of the adding means and the output signal from the first modulator being applied to the quadrature coupler, respectively.

2. A phase modulator comprising
   a plurality of n linear suppressed-carrier amplitude modulators, each modulator comprising a first and a second input terminal and an output terminal characterized in that
   the plurality of n modulators are connected in a cascade arrangement with the output terminal of each modulator connected to the first input terminal of the next modulator in the cascade arrangement, and both the first terminal of the first modulator in the cascade arrangement and all second terminals of the plurality of n modulators are capable of receiving a carrier signal and a modulating signal, respectively;
   the phase modulator further comprising
   a first adding means comprising input terminals which are connected to the first input terminal of the first modulator of the cascade arrangement and the output terminals of the even-numbered modulators of the cascade arrangement, said first adding means being capable of generating an output signal corresponding to the sum of the input signals;
   a second adding means comprising input terminals which are connected to the output terminals of the odd-numbered modulators of the cascade arrangement, the second adding means being capable of generating an output signal corresponding to the sum of the input signals;
   a plurality of n+1 weighting means, each weighting means disposed in a separate one of the input connections to the first and second adding means and capable of introducing a separate predetermined weighting factor to a signal passing therethrough; and
   a quadrature coupler capable of combining in quadrature the output signals from the first and second adding means to provide a phase modulated output signal.

* * * * *